(12) United States Patent
Willmeroth et al.

(10) Patent No.: US 8,101,997 B2
(45) Date of Patent: Jan. 24, 2012

(54) SEMICONDUCTOR DEVICE WITH A CHARGE CARRIER COMPENSATION STRUCTURE IN A SEMICONDUCTOR BODY AND METHOD FOR ITS PRODUCTION

(75) Inventors: Armin Willmeroth, Augsburg (DE); Michael Rueb, Faak am See (AT)

(73) Assignee: Infineon Technologies Austria AG, Villach (AT)

( * ) Notice: Subject to any disclaimer, the term of this patent is extended or adjusted under 35 U.S.C. 154(b) by 755 days.

(21) Appl. No.: 12/111,749

(22) Filed: Apr. 29, 2008

(65) Prior Publication Data
US 2009/0267174 A1    Oct. 29, 2009

(51) Int. Cl.
*H01L 29/66* (2006.01)
(52) U.S. Cl. .................. 257/341; 257/E29.256
(58) Field of Classification Search .......... 257/328, 257/341–342, E29.256, E29.257
See application file for complete search history.

(56) References Cited

U.S. PATENT DOCUMENTS

| | | | |
|---|---|---|---|
| 6,274,904 B1 * | 8/2001 | Tihanyi | 257/329 |
| 6,300,171 B1 * | 10/2001 | Frisina | 438/140 |
| 6,677,643 B2 * | 1/2004 | Iwamoto et al. | 257/341 |
| 6,927,103 B2 * | 8/2005 | Letavic et al. | 438/140 |
| 7,737,469 B2 * | 6/2010 | Saito et al. | 257/197 |
| 2003/0057479 A1 * | 3/2003 | Ahlers et al. | 257/328 |
| 2003/0230767 A1 * | 12/2003 | Tihanyi | 257/200 |
| 2004/0009643 A1 * | 1/2004 | Blanchard | 438/268 |
| 2005/0156235 A1 * | 7/2005 | Fujihira | 257/341 |
| 2007/0176229 A1 * | 8/2007 | Willmeroth et al. | 257/328 |

FOREIGN PATENT DOCUMENTS

DE    10130158         1/2003
DE    10245049 A1  *  4/2004

* cited by examiner

*Primary Examiner* — Kiesha Bryant
*Assistant Examiner* — Ali Naraghi
(74) *Attorney, Agent, or Firm* — Dicke, Billig & Czaja, PLLC

(57) ABSTRACT

A semiconductor device with a charge carrier compensation structure in a semiconductor body and to a method for its production. The semiconductor body includes drift zones of a first conduction type and charge compensation zones of a second conduction type complementing the first conduction type. The drift zones include a semiconductor material applied in epitaxial growth zones, wherein the epitaxial growth zones include an epitaxially grown semiconductor material which is non-doped to lightly doped. Towards the substrate, the epitaxial growth zones are provided with a first conduction type incorporated by ion implantation over the entire surface and with selectively introduced doping material zones of a second, complementary conduction type. Towards the front side, the epitaxial growth zones are provided with a second, complementary conduction type incorporated by ion implantation over the entire surface and with selectively introduced doping material zones of the first conduction type.

10 Claims, 6 Drawing Sheets

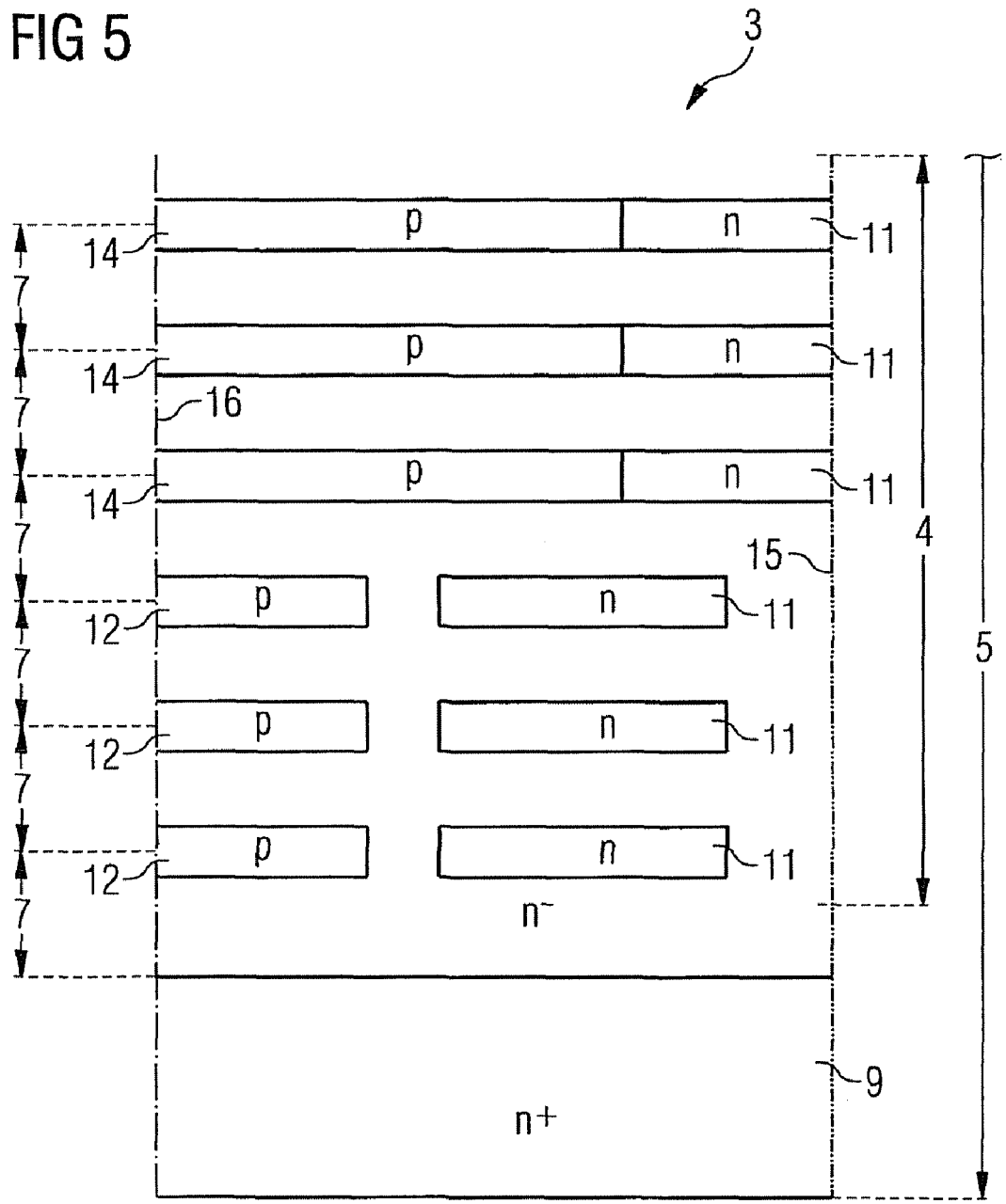

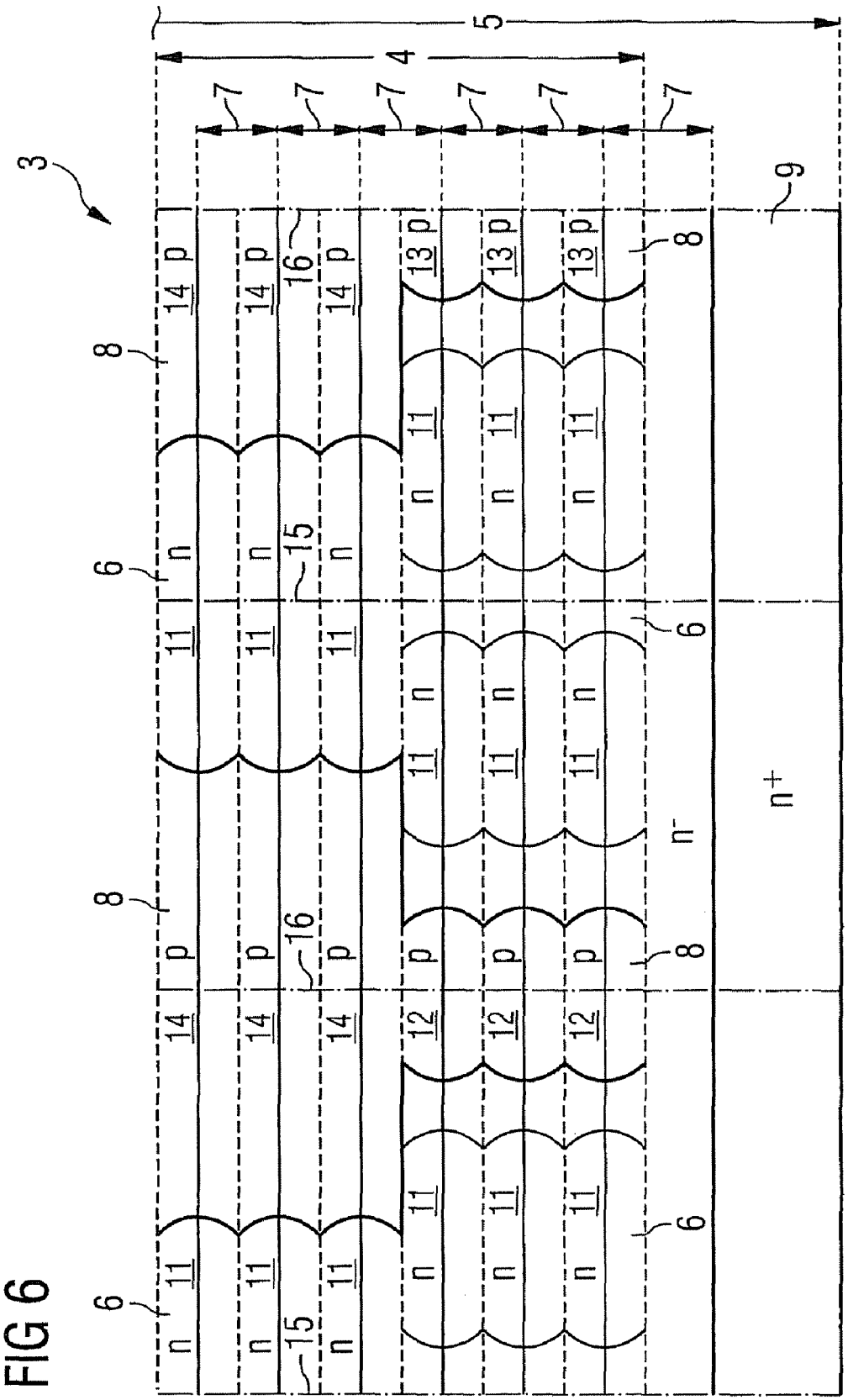

SEMICONDUCTOR DEVICE WITH A CHARGE CARRIER COMPENSATION STRUCTURE IN A SEMICONDUCTOR BODY AND METHOD FOR ITS PRODUCTION

BACKGROUND

The disclosure generally relates to a semiconductor device with a charge carrier compensation structure in a semiconductor body and to a method for its production. The semiconductor body includes drift zones of a first conduction type with a semiconductor material applied epitaxially in epitaxial growth zones. The semiconductor body further includes charge compensation zones of a second conduction type complementing the first conduction type, which are provided with a semiconductor material applied in epitaxial growth zones.

Semiconductor devices of this type are applied to a semiconductor substrate in a multi-epitaxial process, the aim being the production of a high-blocking power transistor with a minimal on resistance. In order to reduce a specific on resistance, the step width between the drift zones and the charge compensation zones is kept to a minimum to permit the use of a very high doping level. This is however counteracted by the tendency towards a lateral spreading of the compensation regions, which are introduced into the epitaxial growth zones by ion implantation and are spread both vertically and laterally by diffusion. In this context, vertical outdiffusion is required for the formation of coherent compensation regions. Lateral outdiffusion, however, is an undesirable side effect.

The lateral spreading of the charge compensation regions makes a minimum step width between drift zones and charge compensation zones difficult to achieve and therefore has to be kept to a minimum. Another factor which counteracts the reduction of this step width is the fact that the typical current density in the device automatically increases as the step width is reduced. This means that in an avalanche situation the modulation of the space charge through the charge carriers becomes increasingly serious as the step width is reduced.

The reduction of the step width further strengthens the influence of common process variations, making the production of avalanche-proof and therefore robust compensated devices difficult. The most widespread process in the production of a compensated device is the homogeneous introduction of a doping material during the epitaxial process followed by the masked selective implantation of a complementary doping material using masks. In this technology, the reduction of the step width is restricted by the fact that the masked implanted doping material is in the diffusion process incorporated into the homogeneously doped epitaxial growth zone to virtually the same degree both laterally and vertically. As a result, the shape of the p-n junction between the compensation regions has bulges in the lateral direction in each epitaxial growth zone.

To avoid such bulges, both types of doping material can be introduced by masked implantation, which however is a cost-intensive process. Identical diffusion coefficients for both doping materials result in similar equiconcentration lines for both types of doping material. In addition, the shape of the p-n junction between the compensation regions becomes nearly vertical with very few bulges. If, however, the diffusion process is excessively long, the doping materials increasingly diffuse into the complementary doping material region and there neutralize the other doping material. This means that considerably more doping material has to be introduced for a preset on resistance than is available for current flow in the drift zones at the end of the process. More doping material, however, automatically leads to increased fluctuations in the production process. A product of this type therefore becomes increasingly difficult to produce for increasing diffusion periods, because absolute misdoping at, for example, a dose error of 2% increases in proportion to the implanted dose in the implantation process.

In addition, semiconductor devices produced using the multi-epitaxial process exhibit a marked electric field strength ripple in the vertical direction in the middle of the drift zone as a result of the masked implantation of both types of doping material. The adjacent arrangement of drift zones and compensation zones moreover automatically produces a transverse magnetic field which drives generated electron precisely into this middle region of the drift zone. There the generated electrons have to pass through the relative field maximum values. This generates additional charge carriers.

To reduce this effect, a complementary doping can be introduced into a homogeneous doping for the drift zone using a mask in the lower region of the charge carrier compensation structure near the drain, while in the region near the source a masking doping of the drift zone is introduced into a complementary and homogeneously applied background doping. If field peaks are to be avoided in the transitional region between the regions near the drain and near the source, however, an additional epitaxial growth zone with a reduced concentration of doping material is required, which increases the on resistance for the device as a whole.

SUMMARY

Disclosed embodiments relate to a semiconductor device with a charge carrier compensation structure in a semiconductor body and to a method for its production. The semiconductor body includes drift zones of a first conduction type and charge compensation zones of a second conduction type complementing the first conduction type. A semiconductor material is applied to the drift zones in epitaxial growth zones, the epitaxial growth zones being provided with a non-doped to lightly doped epitaxially grown semiconductor material. Towards the substrate, the epitaxial growth zones include a first conduction type ion-implanted over the entire surface and selectively introduced doping material zones of the second, complementary conduction type. Towards the front side, the epitaxial growth zones include a second, complementary conduction type ion-implanted over the entire surface and selectively introduced doping material zones of the first conduction type.

BRIEF DESCRIPTION OF THE DRAWINGS

The accompanying drawings are included to provide a further understanding and are incorporated in and constitute a part of this specification. The drawings illustrate embodiments and together with the description serve to explain the principles of the invention. Other embodiments and many intended advantages will be readily appreciated as they become better understood by reference to the following detailed description. The elements of the drawings are not necessarily to scale relative to each other. Like reference numerals designate corresponding similar parts.

FIG. 5 illustrates a section of a semiconductor device with epitaxial growth zones and with a charge compensation structure of a further embodiment, that has been introduced in different ways, prior to an outdiffusion.

FIG. 6 is a diagrammatic cross-section through a semiconductor device according to FIG. 5 after the completion of the outdiffusion.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of various embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
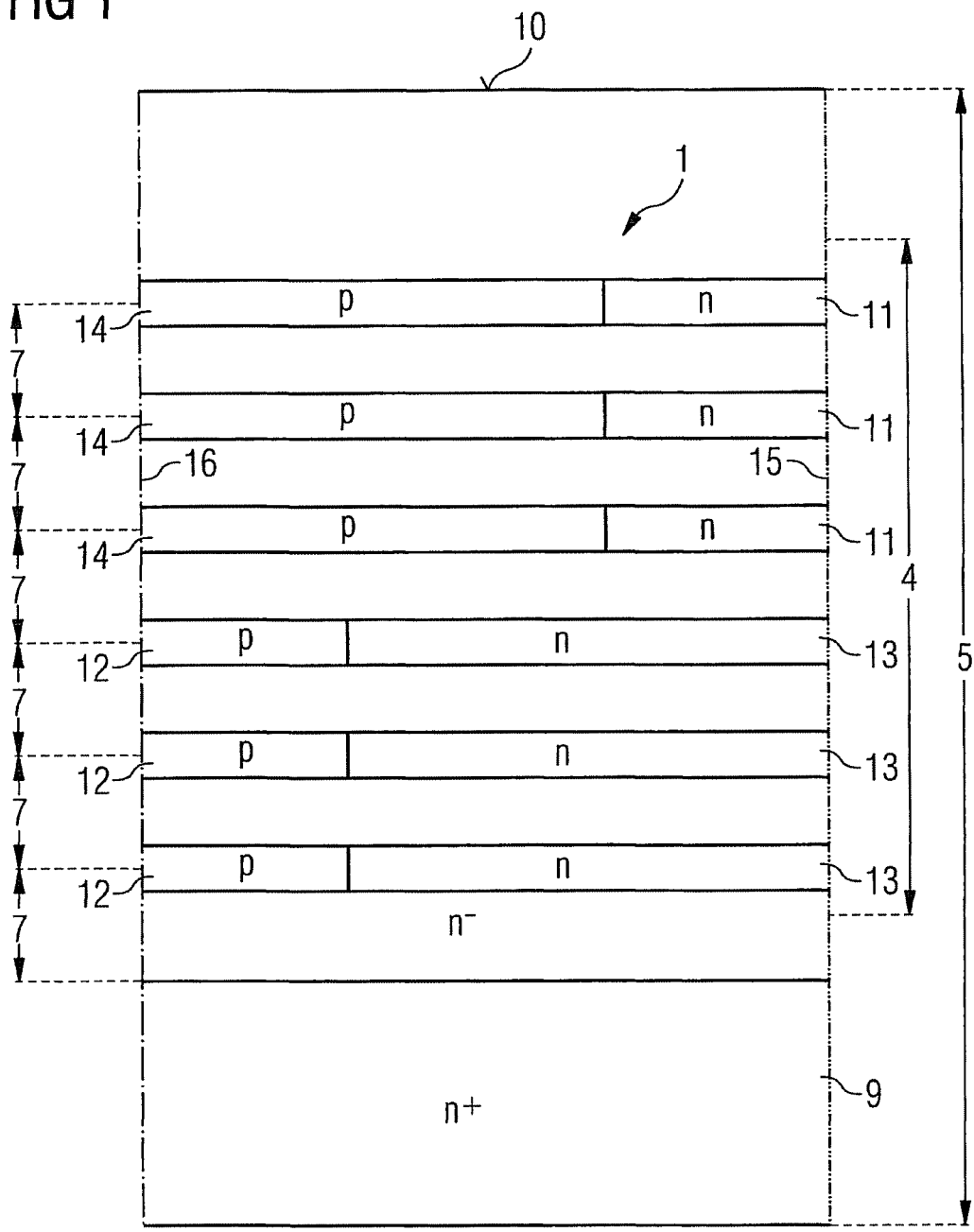
FIG. 1 is a diagrammatic representation of a section of a semiconductor device with epitaxial growth zones and with a charge compensation structure that has been introduced in different ways, prior to an outdiffusion.

FIG. 1 is a diagrammatic representation of a section of a semiconductor device 1 with epitaxial growth zones 7 and with a charge compensation structure 4 has been introduced in different ways. The section of the semiconductor device 1 in FIG. 1 is bounded by a dot-dash line on the left-hand side and marked by a colon-dash line on the right-hand side. The dot-dash line identifies a vertical axis of symmetry 16 of a charge compensation zone. The colon-dash line identifies a vertical axis of symmetry 15 of a drift zone.

As FIG. 1 illustrates, the epitaxial growth zones 7 are initially non-doped or lightly doped, for example with a doping material that makes the epitaxial growth zones 7 n⁻-conducting towards the substrate 9. For such a light n⁻-type doping, impurity atoms of phosphorus or arsenic can be introduced into each of the epitaxial growth zones 7 in the epitaxial growth process on a substrate 9 illustrated in FIG. 1, which in the present case is highly doped and nonconducting. In addition, the epitaxial growth zones 7 can receive an inhomogeneous n⁺-type doping to incorporate a maximum of phosphorus or arsenic into the middle of an epitaxial growth zone 7, while almost no doping materials are incorporated at the beginning and at the end of the epitaxial growth zone 7.

A missing doping material balance is provided in the three epitaxial growth zones 7 towards the substrate 9 in an arrangement that differs from the three upper epitaxial growth zones 7 towards the front side 10 of the semiconductor body 5. In the first three epitaxial growth zones 7 towards the substrate 9, the missing doping material balance for a drift zone is introduced over the entire surface of a drift zone region 13 on a semiconductor wafer by ion implantation, while selective doping material zones 12 are provided for the charge compensation zones by masked implantation.

In the three epitaxial growth zones towards the front side 10, p-type doping materials are first introduced by ion implantation into doping material regions 14 over the entire surface, and the n-type doping material zones 11 are prepared by masked ion implantation. In a following diffusion of the semiconductor device, these n-type doping material zones 11 are introduced with the aid of a mask spread from the axis of symmetry 15 indicated by a colon-dash line towards the compensation zones. As a result, the semiconductor device 1 illustrated in FIG. 2 can be provided, wherein the drift zones with the doping material region 13 implanted over the entire surface become wider towards the substrate than the charge compensation zones.

In each case, such a semiconductor device 1 according to FIG. 1 offers the advantage that there are no voltage peaks between the epitaxial growth zones 7 oriented towards the front side and the epitaxial growth zones 7 oriented towards the substrate, because the epitaxial growth zones 7 are initially either non-doped or only lightly doped, so that there is no need for a compensating epitaxial layer in this transitional region.

Figure 2:
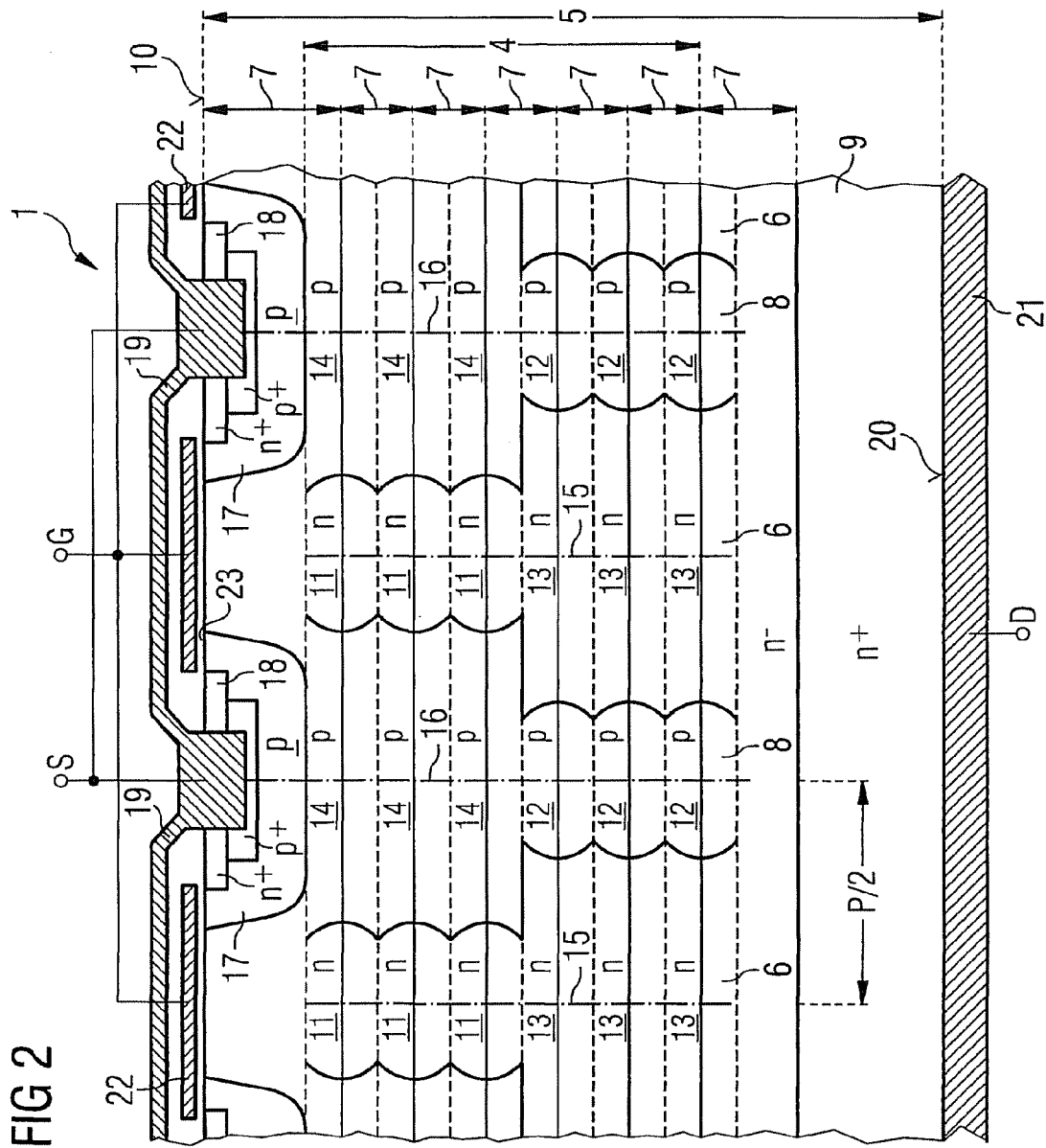
FIG. 2 is a diagrammatic cross-section through a semiconductor device according to FIG. 1 after the completion of the outdiffusion.

FIG. 2 is a diagrammatic cross-section through the semiconductor device 1 according to FIG. 1 after the completion of the production of a, for example, vertical MOS field effect transistor with a lateral gate structure. The invention is however not restricted to lateral gate structures, but can also be applied to trench gate structures, and the basic concept of the invention can be used successfully for IGBTs (insulated gate bipolar transistors) or diodes, for example, with a charge carrier compensation structure.

FIG. 2 illustrates the semiconductor substrate 9, which may be thinned for the finished semiconductor device 1, in order to achieve a further reduction of its forward resistance. For example, if we start with a semiconductor wafer with a thickness of 650 μm (650 micrometers), this can in the case of modern power transistors be reduced to less than 100 μm following the completion of the individual chips on the semiconductor wafer.

On the back side 20 of the substrate 9, which also represents the back side 20 of the semiconductor body 5, this embodiment provides a drain D, which can be represented by a drain metal layer 21 on the back side 20 of the semiconductor body 5. Such metal layers 21 can be applied by vapor deposition, sputtering, chemical or electrodeposition, or else by using spin-on technology. The vertical axes of symmetry 15 of the drift zones 6 are once again marked by colon-dash lines, while the vertical axes of symmetry 16 of the charge carrier compensation zones 8 are identified by dot-dash lines.

While doping material regions 13 of the first n-conduction type introduced by ion implantation over the entire surface alternate with doping material zones 12 of a second, complementary conduction type introduced using a mask towards the substrate 9, this situation is reversed towards the front side 10 of the semiconductor body 5. In this region, doping material regions 14 of the complementary conduction type introduced by ion implantation over the entire surface alternate with doping material zones 11 of the first conduction type. These regions are introduced symmetrically relative to the vertical axes of symmetry 15 of the drift zones and the vertical axes of symmetry 16 of the charge compensation zones.

In this way, column-shaped or strip-shaped charge compensation zones 8 can be generated, with at least strip-shaped drift zones 6 adjacent thereto, wherein the drift zones 6, if viewed in cross-section, bulge in the upper region towards the front side 10 of the semiconductor body 5 while retaining a relatively uniform lateral shape in the region towards the substrate. In addition to the advantage that there is no need for a transitional epitaxial growth zone between the epitaxial growth zones 7 towards the substrate 9 and the epitaxial growth zones 7 towards the front side 10, this structure can contribute to the reduction of the marked ripple of the electric field in the drift zone 6 towards the substrate 9 and in the compensation zones 8 towards the source.

In the diagrammatic cross-section illustrated in FIG. 2, the charge compensation zones 8 are, towards the front side of the semiconductor body 5, adjoined by body zones 17 with a doping which likewise complements that of the drift zones 6, highly doped $n^1$-type source zones 18 being located within the body zones 17. The source zones 18 and the body zones 17 are contacted by a source electrode 19, while gate electrodes 22, which are insulated by a gate oxide 23, drive a channel region between the source zones 18 and the drift zones 6 in the body zone 17 high or low when a suitable voltage is applied to the gate electrode 22. This design of the body zones 17 and the charge compensation zones 8 allows a further reduction of the step width p, while at least the on resistance can be improved by the omission of a lightly doped transitional epitaxial growth zone in the transitional region of the epitaxial growth zones 7.

As a virtually non-doped epitaxial layer is used as a background in the implantation of the two compensating doping materials, there are no field strength peaks in the transitional region between the upper and lower epitaxial growth zones. The concept of the complementary columns, including the advantages in terms of avalanche tolerance, can therefore be implemented without the additional epitaxial layer referred to above. In addition, field ripple can be reduced both in the p-type columns towards the front side 10 and in the n-type strips towards the substrate 9, thus reducing local carrier generation in an avalanche situation.

As a basic concept of the disclosure is the reduction of the ripple of the electric field in the drift zone strips towards the substrate and in the charge compensation columns towards the front side, it is useful to increase both the implantation openings in the masks for the n-type doping towards the substrate 9 and the implantation openings for the p-type doping towards the front side 10. This enables charge compensation zones 8 to spread towards the front side 10 in a V-shape and drift zones 6 to spread towards the substrate 9 in a V-shape.

Figure 3:
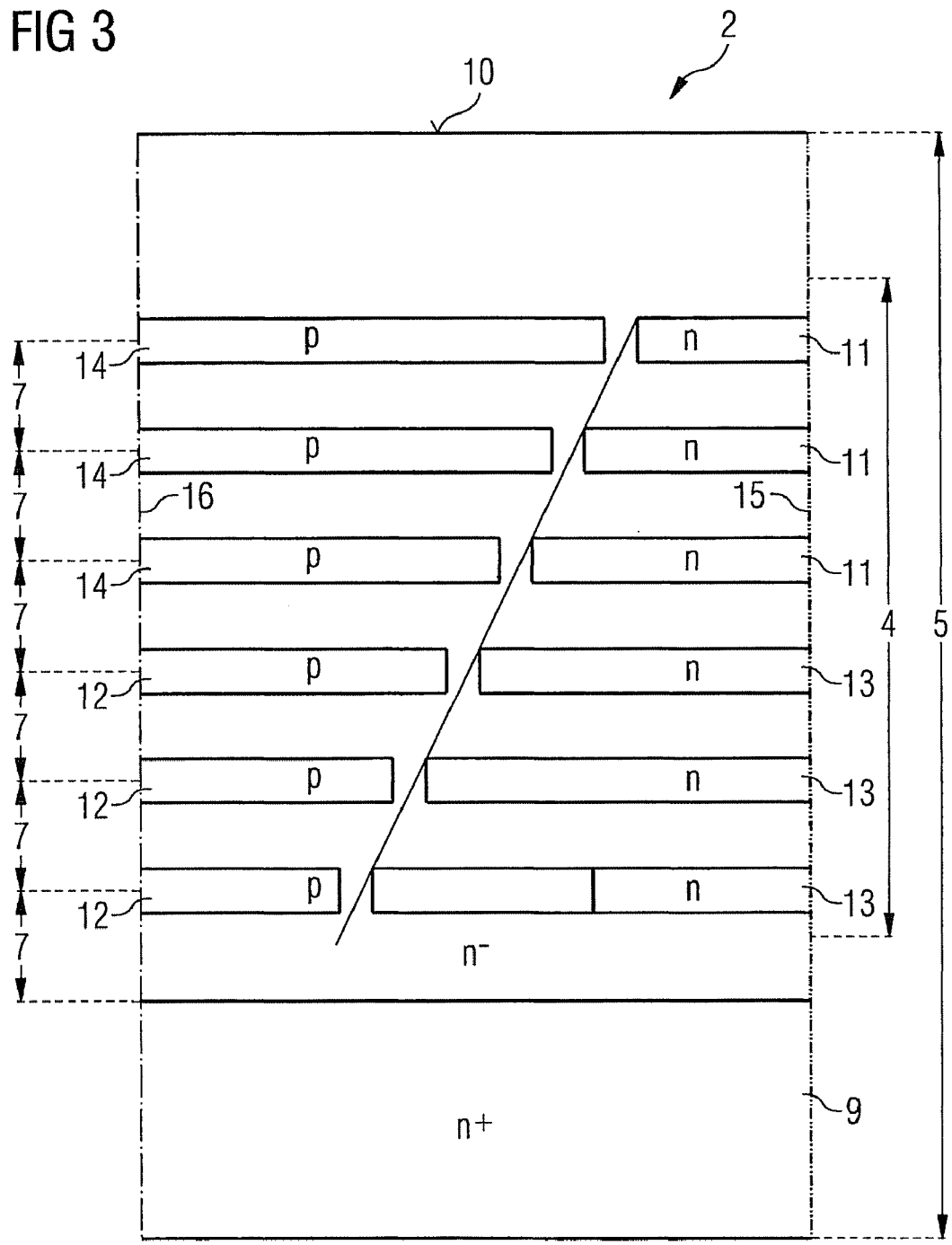
FIG. 3 illustrates a section of a semiconductor device with epitaxial growth zones and with a charge compensation structure of a further embodiment, that has been introduced in different ways, prior to an outdiffusion.

FIG. 3 illustrates a section of a semiconductor device 2 with epitaxial growth zones 7 and with a charge compensation structure 4 of a further embodiment of the invention, which has been introduced in different ways. Components of the same function as in the preceding figures are identified by the same reference numbers and not explained again. A V-shaped spreading of the doping material zones can be achieved by providing that the p-type regions for the charge compensation zones are once again implanted into the epitaxial growth zones 7 over the entire surface towards the front side 10, while the n-type regions for the drift zone are towards the front side 10 provided with sets of masks with gradually reducing ion implantation openings.

Alternatively, the first three epitaxial growth zones 7 applied to the substrate 9 may be doped over the entire surface with a doping material causing n-conduction, and the complementary-conducting regions for the charge compensation zones may be implemented from the substrate with V-shaped openings in the ion implantation masks for a doping material causing p-conduction.

Figure 4:
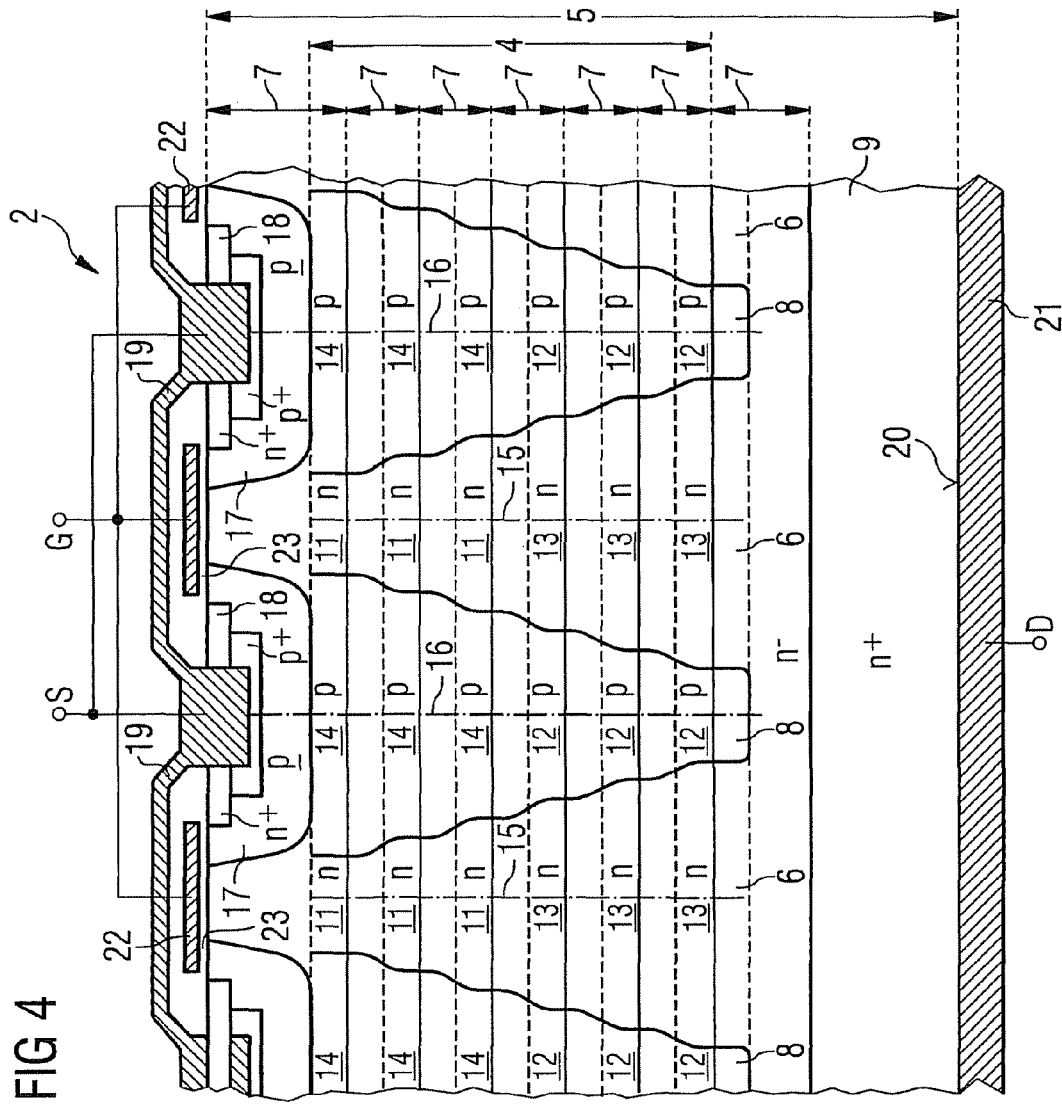
FIG. 4 is a diagrammatic cross-section through a semiconductor according to FIG. 3 after the completion of the outdiffusion.

These measures permit the implementation of a structure as illustrated in FIG. 3, which, after diffusion, provides the semiconductor device 2 of a further embodiment as illustrated in FIG. 4. Here, too, the respective epitaxial growth zones 7 may remain non-doped or doped lightly or inhomogeneously, allowing a maximum of doping material to accumulate in the middle of the epitaxial growth zone 7.

FIG. 4 is a diagrammatic cross-section through the semiconductor device 2 according to FIG. 3 after completion of the semiconductor device 2 on its front side 10 and its back side 20. This semiconductor device 2 is characterised by the V-shaped cross-section of the drift zones 6 and the charge compensation zones 8. In this semiconductor device 2, the step width p can likewise be minimized and the ripple can be reduced, in particular in the drift zone, at least in the region of the vertical axes of symmetry 15 towards the substrate. FIGS. 5 and 6 illustrate a further way of reducing the ripple in the lateral direction along the axes of symmetry 15 of the drift zones 6.

FIG. 5 illustrates a section of a semiconductor device 3 with epitaxial growth zones 7 and with a charge compensation structure 4 of a further embodiment, which has been introduced in different ways. Components of the same function as in the preceding figures are identified by the same reference numbers and not explained again. FIG. 5 illustrates that the p-type regions are first introduced into the epitaxial growth zones 7 by ion implantation over the entire surface towards the front side, while the n-type regions for the drift zones are introduced selectively using masks.

In the three epitaxial growth zones 7 towards the substrate 9, both regions are produced by masked ion implantation, but the mask layout for the drift zone includes a cover in the middle region around the vertical axis of symmetry 15, so that no additional doping material is implanted there and a doping material gap is created there. As a result, the maximum values of the concentration of doping material are not found in the middle region of the vertical axis of symmetry 15 of the diffusion zones—at least towards the substrate—but this embodiment includes two maximum values symmetrical relative to the vertical axis of symmetry 15 in the epitaxial growth zones 7 towards the substrate. This measure can provide a further reduction of the ripple of the field strength distribution along the axis of symmetry 15 in the drift zone towards the substrate 9.

FIG. 6 is a diagrammatic cross-section through a semiconductor device 3 according to FIG. 5, wherein the structure on the front side 10 and the structure on the back side 20 of the semiconductor body 5 have been omitted; these may be identical to the structures illustrated in the preceding figures if a lateral MOSFET is to be produced. However, as stated above, the structures according to the invention can also be used for the charge compensation structures 4 for power diodes, IGBTs, MOSFETs, etc. with a trench gate structure. As FIG. 6 illustrates, the region of the charge carrier compensation zones 8 is highly restricted towards the substrate 9, while the regions of maximum concentration of doping material are symmetrical relative to the vertical axis of symmetry 15.

Although specific embodiments have been illustrated and described herein, it will be appreciated by those of ordinary skill in the art that a variety of alternate and/or equivalent implementations may be substituted for the specific embodiments illustrated and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device with a charge carrier compensation structure in a semiconductor body, comprising:
   a substrate having a top surface;
   a first group of epitaxial growth zones having a first doping type situated adjacent the top surface of the substrate, such that a first one of the epitaxial growth zones covers the entire top surface and the remaining epitaxial growth zones of the first group are stacked on upon another;

a plurality of column shaped charge compensation zones of a second conduction type complementing the first conduction type extending through the first group of epitaxial growth zones such that drift zones of the first conduction type alternate laterally with the column shaped charge compensation zones of the second conduction type;

a second group of epitaxial growth zones having the second conduction type adjacent the first group of epitaxial growth zones, such that the epitaxial growth zones of the second group are stacked one upon another; and a plurality of column shaped drift zones of the first conduction type extending through the second group of epitaxial growth zones such that charge compensation zones of the second conduction type alternate laterally with the column shaped drift zones of the first conduction type;

wherein the column shaped drift zones have a smaller surface area than the drift zones of the first epitaxial growth zones.

2. The semiconductor device of claim 1, wherein the column shaped charge compensation zones extending through the first group of epitaxial growth zones are vertically oriented relative to the charge compensation zones of the second group of epitaxial growth zones, and the column shaped drift zones extending through the second group of epitaxial growth zones are vertically oriented relative to the drift zones of the first group of epitaxial growth zones.

3. The semiconductor device of claim 1, wherein the drift zones of the first group of epitaxial growth zones have a larger surface area towards the substrate than the column shaped charge compensation zones, and wherein the charge compensation zones of the second group of epitaxial growth zones have a larger surface area towards a front side of the device opposite the substrate than the column shaped drift zones.

4. The semiconductor device of claim 1, wherein the charge compensation zones of the second group of epitaxial growth zones each share a vertical axis of symmetry with a corresponding one of the column shaped charge compensation zones.

5. The semiconductor device of claim 1, wherein the drift zones of the first group of epitaxial growth zones each share a vertical axis of symmetry with a corresponding one of the column shaped drift zones.

6. The semiconductor device of claim 1, wherein in at least one of the epitaxial growth zones the maximum values of the doping material distribution of the drift zones are arranged in a horizontal direction not on a vertical axis of symmetry of the drift zones.

7. The semiconductor device of claim 1, wherein the semiconductor device includes a near-surface body zone doped complementary to the first conduction type, in which is located a source zone of the first conduction type doped more highly than the drift section, which, like the body zone, is contacted by a metallic source electrode.

8. A semiconductor device with a charge carrier compensation structure in a semiconductor body, comprising:

a substrate having a top surface;

a first group of epitaxial growth zones having a first doping type situated adjacent the top surface of the substrate, such that a first one of the epitaxial growth zones covers the entire top surface and the remaining epitaxial growth zones of the first group are stacked on upon another;

a plurality of column shaped charge compensation zones of a second conduction type complementing the first conduction type extending through the first group of epitaxial growth zones such that drift zones of the first conduction type alternate laterally with the column shaped charge compensation zones of the second conduction type;

a second group of epitaxial growth zones having the second conduction type adjacent the first group of epitaxial growth zones, such that the epitaxial growth zones of the second group are stacked one upon another; and a plurality of column shaped drift zones of the first conduction type extending through the second group of epitaxial growth zones such that charge compensation zones of the second conduction type alternate laterally with the column shaped drift zones of the first conduction type;

wherein the charge compensation zones of the second group of epitaxial growth zones spread in a V-shape towards a front side of the device and the drift zones of the first group of epitaxial growth zones spread in a V-shape towards the substrate.

9. A semiconductor device with a charge carrier compensation structure in a semiconductor body, comprising:

a substrate having a top surface;

a first group of epitaxial growth zones having a first doping type situated adjacent the top surface of the substrate, such that a first one of the epitaxial growth zones covers the entire top surface and the remaining epitaxial growth zones of the first group are stacked on upon another;

a plurality of column shaped charge compensation zones of a second conduction type complementing the first conduction type extending through the first group of epitaxial growth zones such that drift zones of the first conduction type alternate laterally with the column shaped charge compensation zones of the second conduction type;

a second group of epitaxial growth zones having the second conduction type adjacent the first group of epitaxial growth zones, such that the epitaxial growth zones of the second group are stacked one upon another; and a plurality of column shaped drift zones of the first conduction type extending through the second group of epitaxial growth zones such that charge compensation zones of the second conduction type alternate laterally with the column shaped drift zones of the first conduction type;

wherein the drift zones of the first group of epitaxial growth zones have a larger surface area towards the substrate than the column shaped charge compensation zones, and wherein the charge compensation zones of the second group of epitaxial growth zones have a larger surface area towards a front side of the device opposite the substrate than the column shaped drift zones.

10. The semiconductor device of claim 9, wherein the column shaped drift zones have a smaller surface area than the drift zones of the first epitaxial growth zones.

* * * * *